(12) United States Patent
Kim et al.

(10) Patent No.: US 7,781,819 B2
(45) Date of Patent: Aug. 24, 2010

(54) SEMICONDUCTOR DEVICES HAVING A CONTACT PLUG AND FABRICATION METHODS THEREOF

(75) Inventors: Wan-don Kim, Gyeonggi-do (KR); Jin-yong Kim, Seoul (KR); Yong-suk Tak, Seoul (KR); Jung-hee Chung, Gyeonggi-do (KR); Ki-chul Kim, Gyeonggi-do (KR); Oh-seong Kwon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 92 days.

(21) Appl. No.: 12/270,286

(22) Filed: Nov. 13, 2008

(65) Prior Publication Data
US 2009/0072350 A1    Mar. 19, 2009

Related U.S. Application Data

(60) Continuation-in-part of application No. 11/083,874, filed on Mar. 18, 2005, now abandoned, which is a division of application No. 10/160,646, filed on May 31, 2002, now Pat. No. 6,884,673.

(30) Foreign Application Priority Data

May 31, 2001   (KR) .................. 10-2001-0030529
Feb. 20, 2008   (KR) .................. 10-2008-0015492

(51) Int. Cl.
*H01L 29/92*    (2006.01)

(52) U.S. Cl. .................. 257/306; 257/308; 257/309; 257/532; 257/E21.011; 257/E21.019; 257/E21.649; 438/255; 438/399

(58) Field of Classification Search .......... 257/306, 257/308, 309, 532; 438/255, 399
See application file for complete search history.

(56) References Cited

U.S. PATENT DOCUMENTS 6,130,102 A    10/2000   White et al. ............... 438/3

(Continued)

FOREIGN PATENT DOCUMENTS

JP        2000082683         3/2000

(Continued)

OTHER PUBLICATIONS

Notice to Submit Response, Korean Application No. 10-2001-0030529, Feb. 27, 2003.

*Primary Examiner*—A. Sefer
(74) *Attorney, Agent, or Firm*—Myers Bigel Sibley & Sajovec, P.A.

(57) ABSTRACT

Provided are a semiconductor device and a method of fabricating the same. The semiconductor device includes an insulating layer that is formed on a supporting layer and has a contact hole. A first contact plug is formed on an inner wall and bottom of the contact hole. A second contact plug buries the contact hole and is formed on the first contact plug. A conductive layer is connected to the first contact plug and the second contact plug. The bottom thickness of the first contact plug formed on the bottom of the contact hole is thicker than the inner wall thickness of the first contact plug formed on the inner wall of the contact hole.

20 Claims, 7 Drawing Sheets

U.S. PATENT DOCUMENTS

| | | | |
|---|---|---|---|
| 6,294,424 B1 | 9/2001 | Kang et al. | 438/423 |
| 6,320,213 B1 | 11/2001 | Kirlin et al. | 257/295 |
| 6,340,619 B1 | 1/2002 | Ko | 438/396 |
| 6,352,865 B2 | 3/2002 | Lee et al. | 438/3 |
| 6,384,446 B2 | 5/2002 | Lee et al. | |
| 6,410,400 B1 | 6/2002 | Lee et al. | |
| 6,455,371 B1 | 9/2002 | Yang et al. | 438/253 |
| 6,458,650 B1 | 10/2002 | Huang et al. | |
| 6,479,344 B2 | 11/2002 | Huang et al. | 438/253 |
| 6,479,364 B2 | 11/2002 | Shin et al. | 438/396 |
| 6,518,070 B1 | 2/2003 | Alluri et al. | 438/3 |
| 6,537,875 B2 | 3/2003 | Won et al. | 438/254 |
| 6,580,111 B2 | 6/2003 | Kim et al. | 257/301 |
| 6,583,021 B2 | 6/2003 | Song | 438/396 |
| 6,589,839 B1 | 7/2003 | Basceri et al. | 438/254 |
| 6,884,673 B2 * | 4/2005 | Joo et al. | 438/240 |
| 2002/0135071 A1 * | 9/2002 | Kang et al. | 257/767 |
| 2005/0161727 A1 * | 7/2005 | Joo et al. | 257/309 |

FOREIGN PATENT DOCUMENTS

| | | |
|---|---|---|
| JP | 2001-237400 A | 8/2001 |
| KR | 2002-0037490 A | 5/2002 |

* cited by examiner

SEMICONDUCTOR DEVICES HAVING A CONTACT PLUG AND FABRICATION METHODS THEREOF

CROSS-REFERENCE TO RELATED PATENT APPLICATIONS

This application is a Continuation In Part (CIP) application of U.S. patent application Ser. No. 11/083,874, filed on Mar. 18, 2005, now abandoned which is a divisional application of U.S. patent application Ser. No. 10/160,646 filed May 31, 2002 and issued as U.S. Pat. No. 6,884,673, which claims the benefit and priority to Korean Patent Application No. 10-2001-0030529, filed on May 31, 2001. This application further claims the priority of Korean Patent Application No. 10-2008-0015492, filed on Feb. 20, 2008, in the Korean Intellectual Property Office, the disclosures of which are hereby incorporated herein by reference.

BACKGROUND OF THE INVENTION

1. Field of the Invention

The present invention relates to semiconductor devices and fabrication methods thereof, and, more particularly, to semiconductor devices having a contact plug and fabrication methods thereof.

2. Description of the Related Art

Generally, as a semiconductor device becomes more integrated, a low conductive film is created between a dielectric film and a polysilicon film in the conventional metal insulator silicon (MIS) capacitor, and, thus, adequate capacitance may be obtained. Hence, a metal insulator metal (MIM) capacitor may be needed to replace the MIS capacitor.

Typically, an MIM capacitor has an upper electrode and a lower electrode, each of which is formed of a metal film, and a dielectric (conductive) film interposed between the electrodes. The MIM capacitor is formed on a contact plug on a silicon substrate. The contact plug is formed of a TiN film. The contact pug connects the MIM capacitor with a driving transistor to accumulate or discharge electric charge in/from the MIM capacitor.

A contact plug, which enables the MIM capacitor to connect with the silicon substrate, is oxidized when a lower electrode of the MIM capacitor is formed, a dielectric film is deposited or heat processing is performed after deposition of the dielectric film. When the contact plug is oxidized, contact resistance between the MIM capacitor and the silicon substrate increases, or even worse, the MIM capacitor may not be electrically connected with the silicon substrate.

In particular, as the degree of integration of a semiconductor device increases, the size of a contact plug may become smaller. Accordingly, the possibility of contact plug oxidation grows, and hence, a problem of contact resistance, as described above, may become more serious.

SUMMARY

Embodiments of the present invention provide a semiconductor device having a contact plug, which can reduce contact resistance.

Embodiments of the present invention also provide a method of fabricating a semiconductor device having a contact plug that can reduce contact resistance.

According to an aspect of the present invention, there is provided a semiconductor device comprising an insulating layer that is formed on a supporting layer and has a contact hole; a first contact plug that is formed on an inner wall and bottom of the contact hole; a second contact plug that buries the contact hole and is formed on the first contact plug; and a conductive layer that is connected to the first contact plug and the second contact plug.

The bottom thickness of the first contact plug formed on the bottom of the contact hole may be thicker than the inner wall thickness of the first contact plug formed on the inner wall of the contact hole. The first contact plug may comprise a bottom plug formed on the bottom of the contact hole and an inner plug formed on the inner wall of the contact hole. The sum of the thickness of the bottom plug and the thickness of the inner plug formed on the bottom plug is about equal to the bottom thickness of the first contact plug.

The thickness of the inner plug formed on the bottom plug and the thickness of the inner plug formed on the inner wall of the contact hole may be about the same as each other or different from each other.

The first contact plug may be formed of a refractory metal film and the second contact plug may be formed of a noble metal film. The supporting layer may be a semiconductor substrate or a polysilicon layer.

According to another aspect of the present invention, there is provided a semiconductor device comprising a first insulating layer that is formed on a supporting layer and has a first contact hole; a first contact plug that is formed on an inner wall and bottom of the first contact hole and has a bottom thickness thicker than the inner wall thickness of the first contact hole; a second contact plug that buries the first contact hole and is formed on the first contact plug; a second insulating layer that is deposited on the first contact plug and the second contact plug and has a second contact hole that exposes the first and second contact plugs; a lower electrode of a metal insulator metal (MIM) capacitor, which is deposited on the first and second contact plugs in the second contact hole, has a thickness thicker than the thickness of the second insulating layer, and is formed of a metal layer; a dielectric layer of the MIM capacitor that is formed on the lower electrode; and an upper electrode of the MIM capacitor that is deposited on the dielectric layer and formed of a metal layer.

The first contact plug may comprise a bottom plug formed on the bottom of the first contact hole and an inner plug formed on the bottom plug and the inner wall of the first contact hole. The thickness of the inner plug formed on the bottom plug and the thickness of the inner plug formed on the inner wall of the first contact hole may be about the same as each other or different from each other. The thickness of the first contact plug formed on the bottom of the contact hole may range between about 100 and 500 Å.

The lower and upper electrodes may be formed of noble metal films, noble metal conductive oxide films, and/or conductive oxide films of a perovskite structure, and the dielectric layer may be formed of a high dielectric film of a perovskite structure.

According to another aspect of the present invention, there is provided a method of fabricating a semiconductor device, the method comprising depositing an insulating layer having a contact hole on a supporting layer; forming a bottom plug on the bottom of the contact hole; forming a first contact plug, which includes the bottom plug and an inner wall plug formed on the bottom plug and an inner wall of the contact hole and has a bottom thickness thicker than a thickness of the inner wall of the contact hole; and forming a second contact plug on the first contact plug by burying the contact hole.

The bottom plug may be formed by partly etching a refractory metal film, which is buried into the contact hole. The inner wall plug may be formed on the inner wall of the contact hole and have either substantially uniform or uneven thickness. The first contact plug on the bottom of the contact hole may have a thickness of between about 100 and 500 Å.

The method may further comprise, after forming the second contact plug, depositing a second insulating layer on the first contact plug and the second contact plug, the second insulating layer having a second contact hole that exposes the first and second contact plugs; forming a lower electrode of an MIM capacitor, which is formed of a metal layer, on the first contact plug and the second contact plug in the second contact hole to have a thickness thicker than a thickness of the second insulating layer; depositing a dielectric layer of an MIM capacitor on the lower electrode; and forming an upper electrode of an MIM capacitor, which is formed of a metal layer, on the dielectric layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
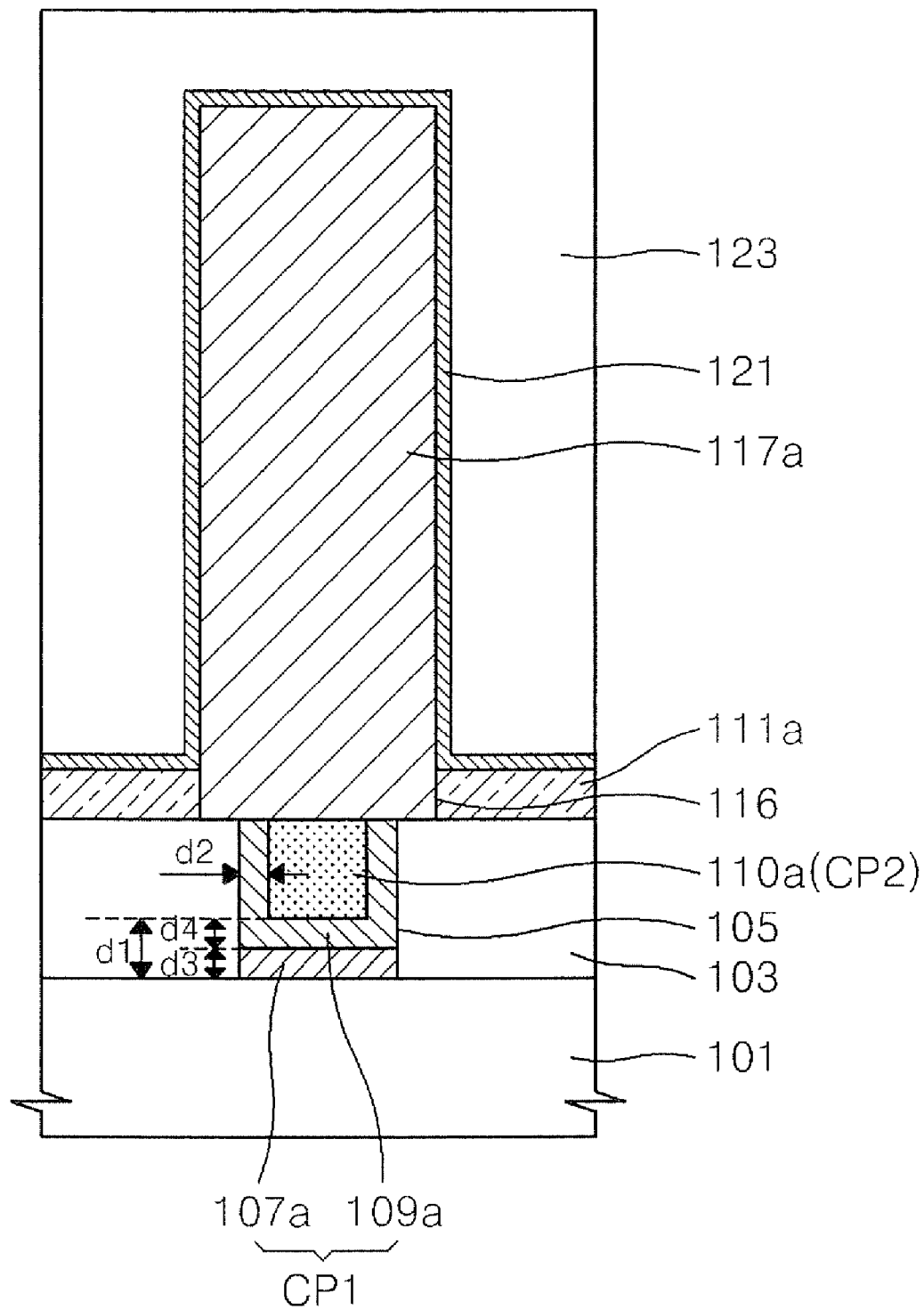
FIG. 1 is a cross-sectional view of a semiconductor device having a contact plug, according to an embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

A semiconductor device according to some embodiments of the present invention has a contact plug which is formed by forming a thin first contact plug of a refractory metal layer in a contact hole, which exposes, for example, a semiconductor substrate or polysilicon layer, and forming a second contact plug of a noble metal layer on the first contact plug while burying the contact hole. Particularly, in the semiconductor device according to some embodiments of the present invention, the second contact plug to be buried in the contact hole is formed of a noble (precious) metal layer, for example, Pt, Ru, or Ir layer. The contact plug can reduce the amount of oxygen entering the first contact plug from an electrode of a metal insulator metal (MIM) capacitor, which is formed of a conductive layer, for example, a noble metal film, noble metal conductive oxide film, or a conductive oxide film of a perovskite structure, thereby reducing or preventing the oxidization of the first contact plug.

In addition, the semiconductor device according to some embodiments of the present invention includes a contact plug by disposing a second contact plug of a noble metal layer on the first contact plug, which is formed on the bottom of the contact hole and formed of a refractory metal layer and has a thick thickness, while burying the contact hole. Such a contact plug can reduce or prevent oxygen from entering the first contact plug from an electrode of a conductive layer, for example, an MIM capacitor, thereby reducing the oxidization of the first contact plug.

Consequently, the semiconductor device according to some embodiments of the present invention can reduce contact resistance between the first contact plug and a supporting layer.

FIG. 1 is a cross-sectional view of a semiconductor device having a contact plug according to an embodiment of the present invention.

Referring to FIG. 1, a first insulating layer 103, which has a first contact hole 105, is deposited on a supporting layer 101 to expose a part of the supporting layer 101. The supporting layer 101 may be a semiconductor substrate, for example, a silicon substrate or a polysilicon layer. If the supporting layer is a semiconductor substrate, a lower part of the first contact hole 105 may have an impurity region formed thereon. The first insulating layer 103 is formed of a silicon oxide film.

A first contact plug CP1 is formed on an inner wall and bottom surface of the first contact hole 105. The first contact plug CP1 is buried in the first contact hole 105. Part of the first contact hole 105 is filled with the first contact plug CP1. The first contact plug CP1 may be formed on the inner wall and bottom of the first contact hole 105 to improve adhesion between the first contact plug CP1 and a second contact plug 110a (CP2), which will be formed later, and to reduce contact resistance.

The first contact plug CP1 is composed of a bottom plug 107a formed on the bottom of the first contact hole 105, and an inner plug 109a formed on the bottom plug 107a and the inner wall of the first contact hole 105. The thickness d4 of the inner plug 109a formed on the bottom plug 107a and the thickness d2 of the inner plug 109a formed on the inner wall of the first contact hole 105 may be about the same as each other, as shown in FIG. 1. However, the thicknesses d4 and d2 of the inner plug 109a can differ from each other.

The first contact plug CP1, that is, the bottom plug 107a and the inner plug 109a, is formed of refractory metal film. The refractory metal film forming the first contact plug CP1 may be one of W film, WN film, Ti film, TiN film, TiAlN film, TiSiN film, Ta film, TaN film, TaAlN film, and/or TaSiN film.

The bottom thickness d1 of the first contact plug CP1 is the sum of the thickness d3 of the bottom plug 107a and the thickness d4 of the inner plug 109a formed on the bottom plug 107a. Consequently, the bottom thickness d1 of the first contact plug CP1 formed on the first contact hole 105 is greater than the thickness d2 of the inner wall of the first contact plug CP1 which is formed on the inner wall of the first contact hole 105. In other words, the bottom thickness d1 of the first contact plug CP1 is greater than the inner wall thickness d2 of the first contact plug CP1.

As described above, when the bottom thickness d1 of the first contact plug CP1 formed on the bottom of the first contact hole 105 is designed to be greater than the inner wall thickness d2 of the first contact plug CP1 formed on the inner wall of the first contact hole 105, oxygen that is contained in a conductive layer or used later in the course of depositing or annealing a conductive layer can be substantially reduced or prevented from entering the supporting layer 101 on the lower part of the first contact hole 105, and, thus the contact resistance between the first contact plug CP1 and the supporting layer 101 can be significantly reduced.

Particularly, the bottom thickness d1 of the first contact plug CP1 is formed to be more than 100 Å, such as between about 100 and 500 Å. For example, the bottom plug 107a is formed to have a thickness of between about 50 and 400 Å, and the inner plug 109a is formed to have a thickness of between about 50 and 100 Å. In this case, as described above, oxygen can be considerably reduced or prevented from entering the supporting layer 101 on the lower part of the first contact hole 105, and, hence the contact resistance between the first contact plug CP1 and the supporting layer 101 can be reduced.

Although it is possible to reduce or prevent oxygen from entering the first contact plug CP1 even when the bottom thickness and inner wall thickness of the first contact plug CP1 are the same each other, in a high-integrated semiconductor device having a contact hole with a small diameter, the possibility of oxidization of the first contact plug CP1 can increase when the bottom thickness d1 of the first contact plug CP1 is thinner than a proper thickness, for example, about 100 Å.

Although in FIG. 1 the first contact plug CP1 formed on the bottom of the first contact hole 105 is illustrated in a manner that it is divided into the bottom plug 107a and the inner plug 109a, the bottom plug 107a formed on the bottom of the first contact hole 105 and the inner plug 109a can be formed as a single body. As described above, the bottom thickness d1 of the first contact plug CP1 is set to be thicker than a proper thickness to reduce the possibility of oxidization of the first contact plug CP1 formed on the bottom of the first contact hole 105.

A second contact plug 110a or CP2 is formed on the first contact plug CP1, that is, the inner plug 109a, while burying the first contact hole 105. The second contact plug 110a or CP2 is buried into the first contact hole 105. The second contact plug 110a or CP2 may be formed of a noble metal film, for example, Pt film, Ru film, and/or Ir film.

A second insulating layer 111a having a second contact hole 116 that exposes the first contact plug CP1 and the second contact plug 110a (CP2) is deposited on the first insulating layer 103. The second insulating layer 111a is formed as an etching stop pattern. The second insulating layer 111a protects the first insulating layer 103 during the capacity fabrication process.

A lower electrode 117a of the MIM capacitor, which is formed of a metal layer and has a thicker thickness than the second insulating layer 111a, is deposited on the first contact plug CP1 and the second contact plug 110a or CP2 in the second contact hole 116. The lower electrode 117a is a stack type and is formed of a noble metal film such as Pt, Ru, and/or Ir, a noble metal conductive oxide film such as PtO, $RuO_2$, and/or $IrO_2$, or a conductive oxide film, such as $SrRuO_3$, $BaRuO_3$, $CaRuO_3$, $(Ba, Sr)RuO_3$, and/or $La(Sr, Co)O_3$, of a perovskite structure.

A dielectric layer 121 is formed on a lower electrode 117a of the MIM capacitor. The dielectric layer 121 covers the whole lower electrode 117a. The dielectric layer 121 is formed of a high dielectric film, such as $(Ba, Sr)TiO_3$, $SrTiO_3$, $BaTiO_3$, $Ba(Zr, Ti)O_3$, $Sr(Zr, Ti)O_3$, $Pb(Zr, Ti)O_3$, and/or $(Pb, La)(Zr, Ti)O_3$, of a perovskite structure.

An upper electrode 123 of the MIM capacitor, which is formed of a metal layer, is deposited on the dielectric layer 121. The upper electrode 123 is formed of the same material as that of the lower electrode 117a. Thus, the MIM capacitor comprises the lower electrode 117a, the dielectric layer 121, and the upper electrode 123. Also, the first contact plug CP1 and the second contact plug 110a (CP2) connects the MIM capacitor with a driving transistor (not shown) to have electric charges accumulated in or discharged from the MIM capacitor.

Figure 2:
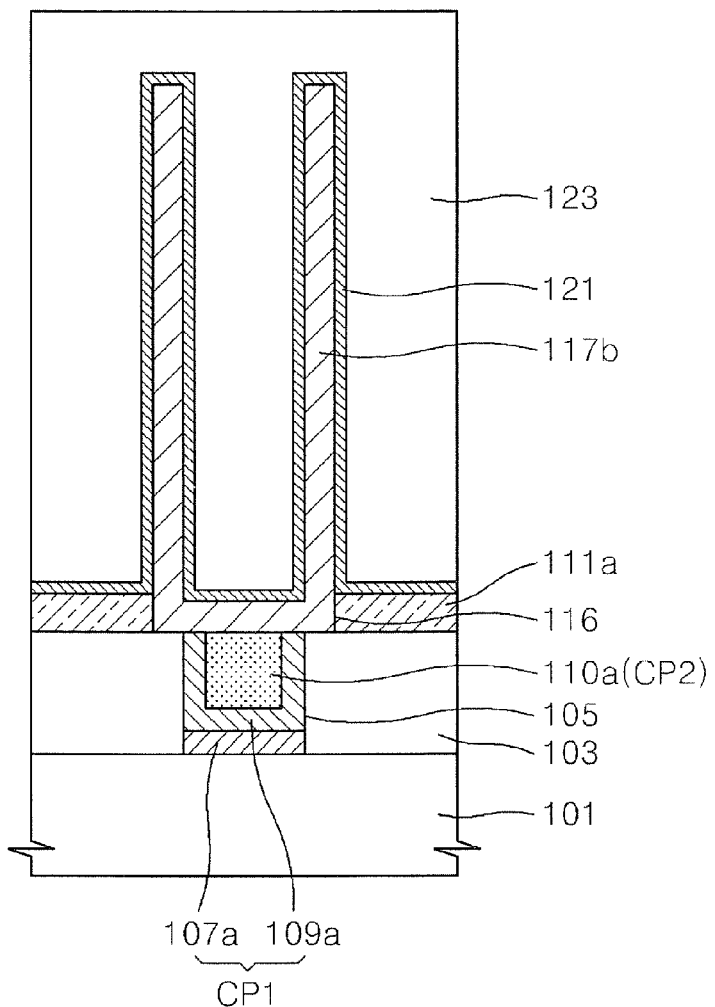
FIG. 2 is s a cross-sectional view of a semiconductor device having a contact plug, according to an embodiment of the present invention.

FIG. 2 is a cross-sectional view of a semiconductor device having a contact plug, according to an embodiment of the present invention.

In FIG. 2, like number numerals denote like elements. The semiconductor device in FIG. 2 is similar to the semiconductor device in FIG. 1 except that a lower electrode 117b of a capacitor in FIG. 2 is a cylinder type. The lower electrode 117b of a cylinder type of a capacitor can enhance capacitance.

FIGS. 3 to 11 are cross-sectional views of the semiconductor device in FIG. 1 for explaining a method of fabricating the semiconductor device according to some embodiments of the present invention.

Figure 3:
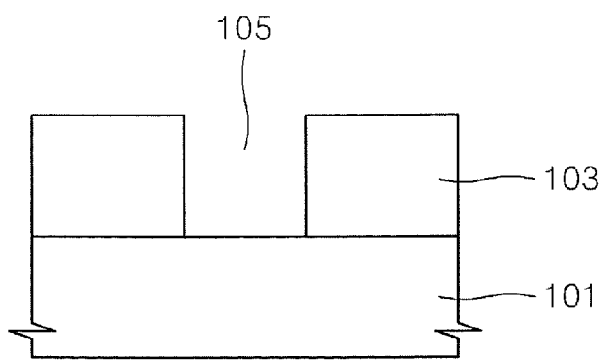
FIGS. 3 to 11 are cross-sectional views of the semiconductor device in FIG. 1 for explaining a method of fabricating the semiconductor device.

Referring to FIG. 3, a first insulating layer 103 is deposited on a supporting layer 101, for example, a semiconductor substrate or a polysilicon layer. The first insulating layer 103 is formed using a silicon oxide film. Then, the first insulating layer 103 is patterned using a photo-etching process to form a first contact hole 105, which exposes part of the supporting layer 101.

Figure 4:
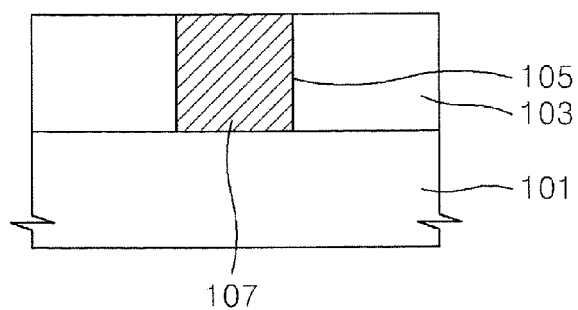

Referring to FIG. 4, a first metal layer 107 for a contact plug is formed to bury the first contact hole 105. The first metal layer 107 may be formed using atomic layer deposition (ALD), chemical vapor deposition (CVD), or physical vapor deposition (PVD). It would be desirable that the first metal layer 107 is formed by ALD or CVD, which has a high step coverage characteristic. The first metal layer 107 for the contact plug is formed only in the first contact hole 105 by forming a refractory metal layer on the whole surface of the supporting layer 101 to bury the first contact hole 105 and performing chemical-mechanical polishing or etching.

The first metal layer 107 is formed of a refractory metal film, for example, a W film, WN film, a TiN film, a TiAlN film, a TiSiN film, a Ta film, a TaN film, TaAlN film, and/or TaSiN film, as described above. The first metal layer 107 may be formed of a single film of the above-described material, or combination films of the materials.

Figure 5:
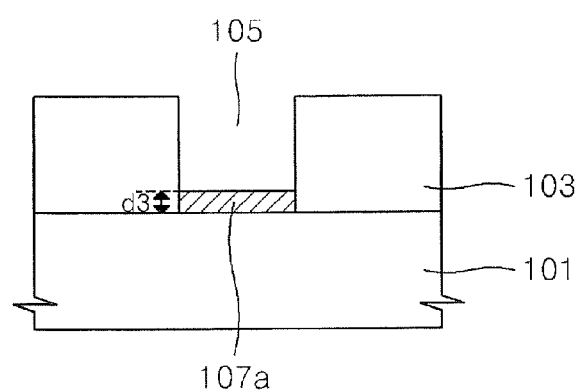

Referring to FIG. 5, a bottom plug 107a with a particular thickness d3 is formed on the bottom of the first contact hole by wet or dry etching the first metal layer 107 for a contact plug. As described above, the bottom plug 107a forms a first contact plug CP1 or 110a. The thickness d3 of the bottom plug 107a is between about 50 and 400 Å, for example, about 150 Å in particular embodiments.

Figure 6:
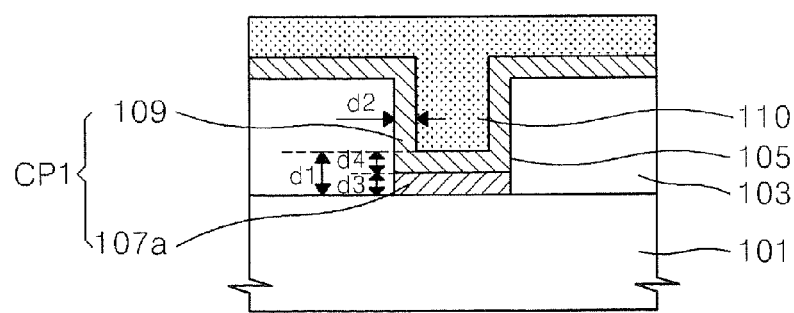

Referring to FIG. 6, a second metal layer 109 for a contact plug is deposited on the inner wall of the first contact hole 105 on the bottom plug 107a and the first insulating layer 103. The thickness of the second metal layer 109 is between about 50 and 100 Å. The second metal layer 109 may be formed by ALD, CVD, or PVD. However, it may be desirable for the second metal layer 109 to be formed by ALD or CVD, which has a high step coverage characteristic.

If the second metal layer 109 is formed by either ALD or CVD with a high step coverage characteristic, as shown in FIG. 6, the thicknesses of parts of the second metal layer 109, one of which is formed on the inner wall of the first contact hole 105 and the other of which is formed on the bottom plug 107a, are about the same. However, when the step coverage characteristic is poor, the second metal layer 109 could have an uneven thickness on the inner wall of the first contact hole 105 and the bottom plug 107a. As a result of forming the second metal layer 109, the first contact plug CP1 with a thick thickness is formed on the bottom plug 107a.

Although procedures for fabricating the bottom plug 107a and procedures for fabricating the second metal layer 109 for an inner plug are described separately in FIGS. 5 and 6, metal layers 107a and 109 can be simultaneously deposited on the bottom of the first contact hole 105 without separately depositing the metal layers 107a and 109 as long as the metal layers 107a and 109 can have sufficiently thick thicknesses. It will suffice if the thick first contact plug CP1 of a particular thickness is formed on the bottom of the first contact hole 105 as described above.

The second metal layer 109 is formed of a refractory metal layer, for example, a W film, WN film, a TiN film, a TiAlN film, a TiSiN film, a Ta film, a TaN film, TaAlN film, and/or TaSiN film, as described above. The second metal layer 109 may be formed of a single film of the above-mentioned material, or combination films of the materials.

Then, a third metal layer 110 for a second contact plug is formed on the second metal layer 109 for a contact plug to bury the first contact hole 105. The third metal layer 110 can easily bury the second contact hole 105 because the bottom plug 107a and the second metal layer 109 are formed in the first contact hole 105. The third metal layer 110 has a thickness between about 50 and 500 Å. The third metal layer 110 may be formed by ALD, CVD, or PVD. The third metal layer 110 for the second contact plug may be formed of a noble metal film, for example, Pt, Ru, and/or Ir. The third metal layer 110 may be formed of a single film of the above-mentioned material, or combination films of the materials.

Figure 7:
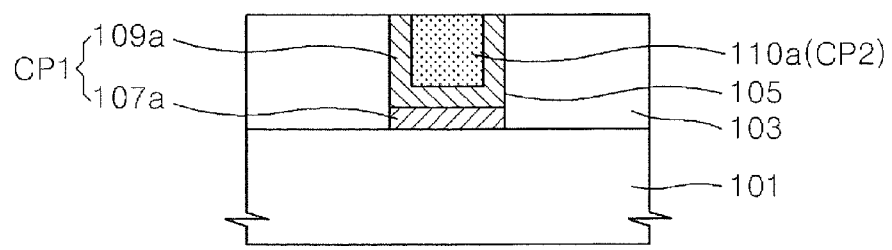

Referring to FIG. 7, the third and second metal layers 110 and 109 are etched to expose a surface of the first insulating layer 103. That is, the third metal layer 110 and the second metal layer 109 on the first insulating layer 103 are etched. Consequently, an inner wall plug 109a, which is formed of the second metal layer 109, is formed on the inner wall of the first contact hole 105 and the bottom plug 107a. The bottom plug 107a and the inner wall plug 109a form the first contact plug CP1. Also, a second contact plug CP2, which is formed of the third metal layer 110a, is formed while burying the first contact hole 105 on the inner wall plug 109a.

Figure 8:
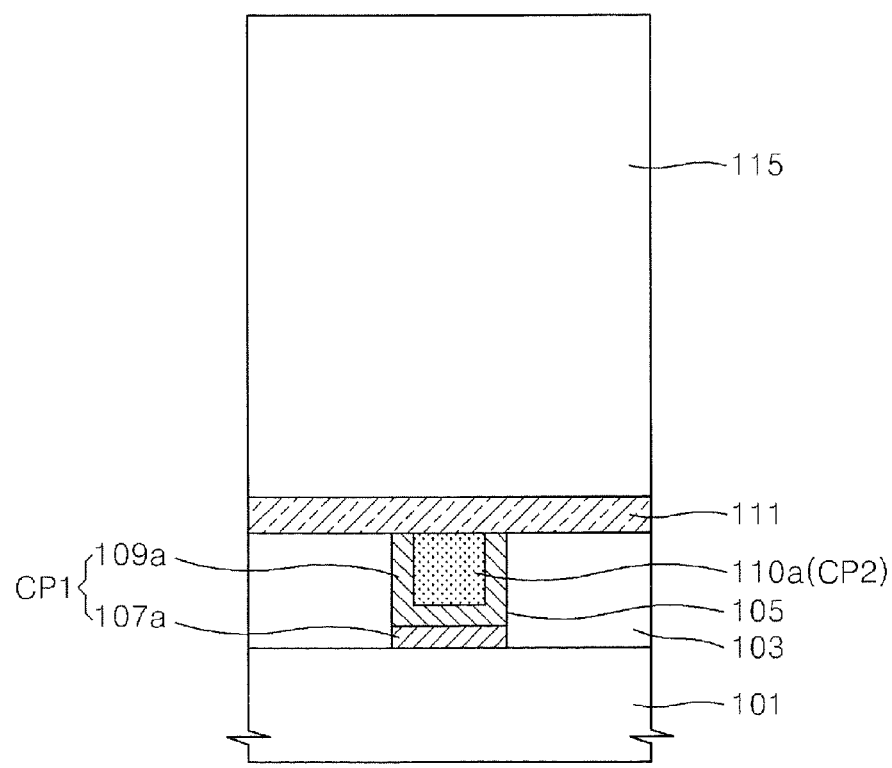

Referring to FIG. 8, an etching stop layer 111 is formed on the first contact plug CP1, the second contact plug CP2, and the first insulating layer 103. The etching stop layer 111 is deposited to protect the first insulating layer 103. The etching stop layer is formed of an insulating layer, for example, a silicon nitride film, a tantalum nitride film, or a composition film thereof.

A mold layer 115, which is formed of silicon oxide, is deposited on the etching stop layer 111. The mold layer 115 is to help to stably form a lower electrode of the MIM capacitor.

Figure 9:
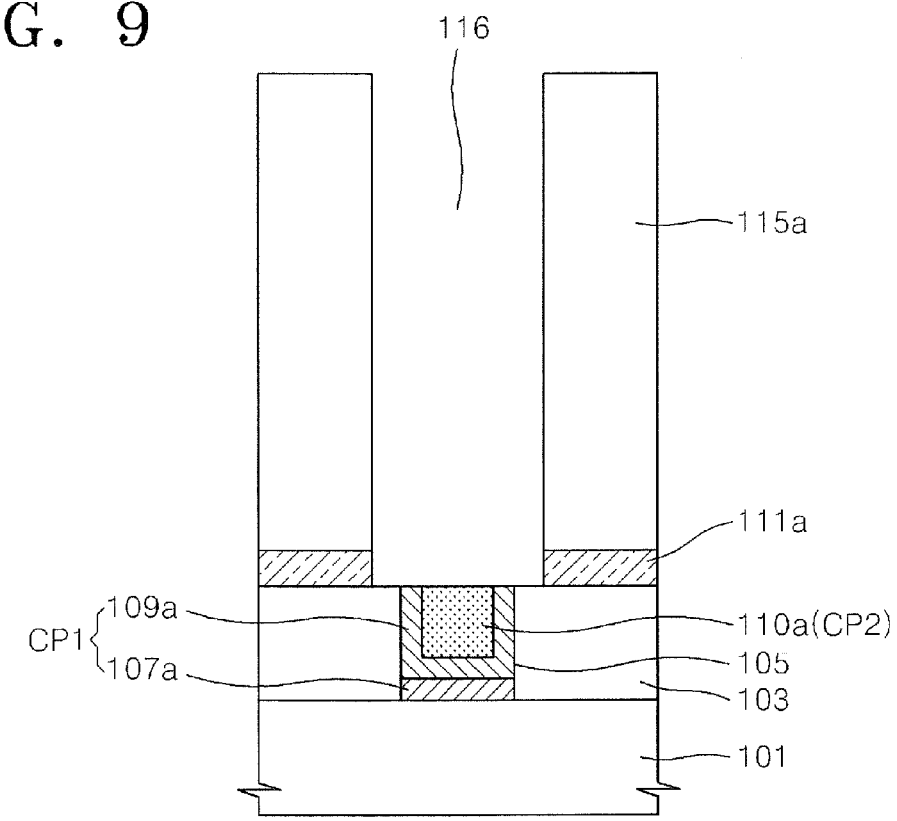

Referring to FIG. 9, a second contact hole 116 is formed on the first contact plug CP1 and the second contact plug CP2 or 110a by patterning the mold layer 115 and the etching stop layer 111. The second contact hole 116 is formed by etching the mold layer 115 using the etching stop layer 111 as an etching stop film and then etching the etching stop layer 111 as well. As a result, the second insulating layer 111a and a mold layer pattern 115a are formed on the first insulating layer 103.

Figure 10:
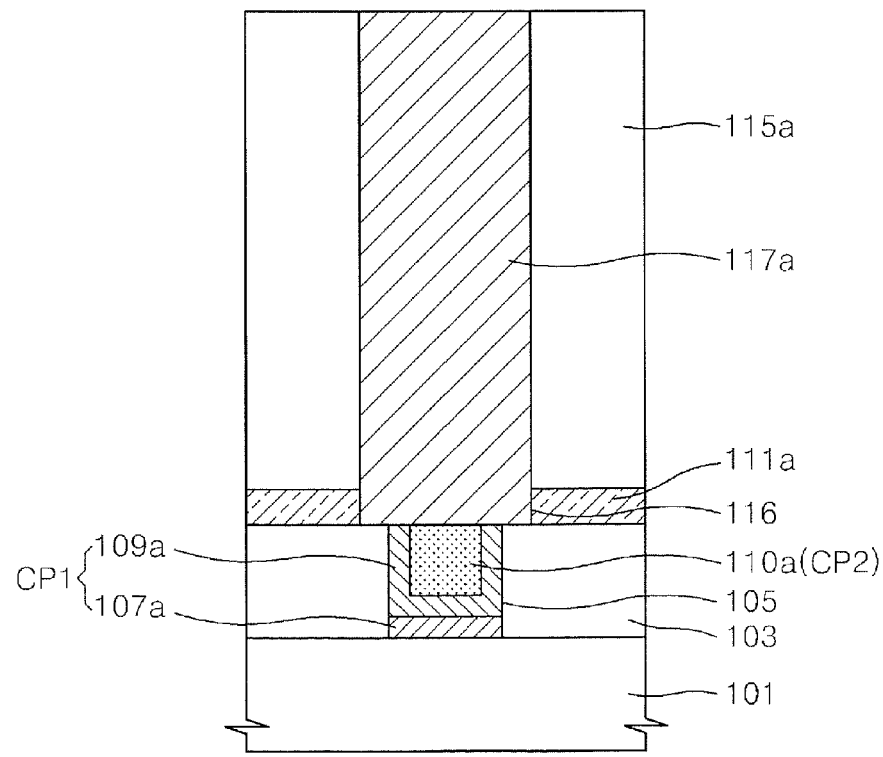

Referring to FIG. 10, a lower electrode of the MIM capacitor is formed on the first contact plug CP1 and the second contact plug 10a in the second contact hole 116. The lower electrode 117a is formed by burying a metal layer for a lower electrode fully in the second contact hole 116 and chemical-mechanical polishing or dry etching the metal layer. Thus, the lower electrode 117a is formed only in the second contact hole 116, and has a thickness thicker than that of the second insulating layer 111a.

The lower electrode 117a is formed of a noble metal film such as Pt, Ru, and/or Ir, a noble metal conductive oxide film such as PtO, $RuO_2$, and/or $IrO_2$, or conductive oxide film, such as $SrRuP_3$, $BaRuO_3$, $CaRuO_3$, $(Ba, Sr)RuO_3$, and/or $La(Sr, Co)O_3$, of a perovskite structure.

Figure 11:
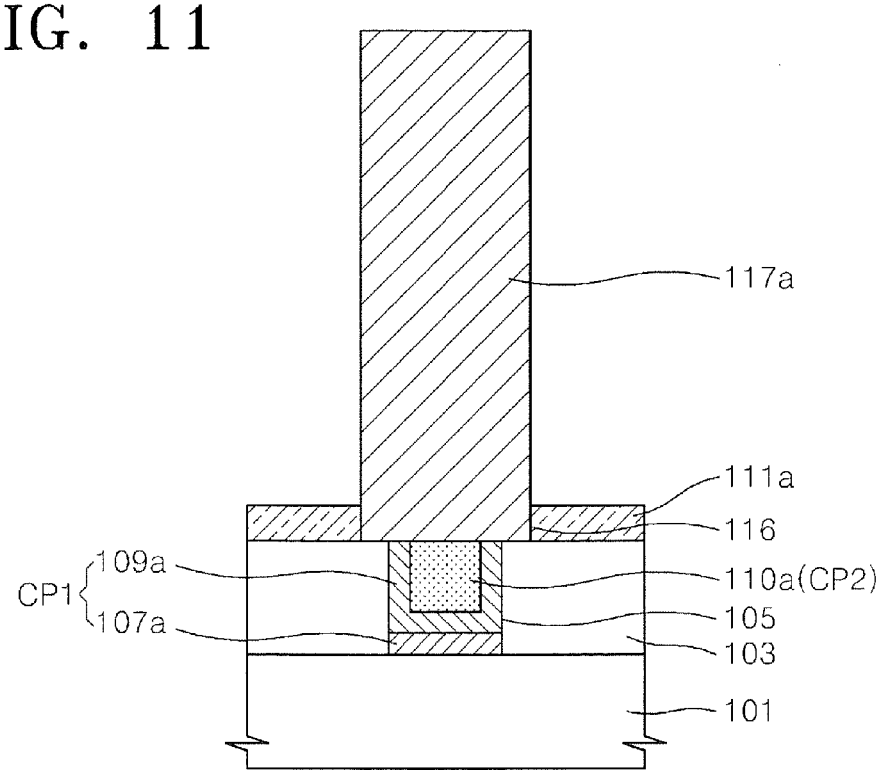

Referring to FIG. 11, the mold layer pattern 115a is removed by wet etching process using the second insulating layer 111a as an etching stop film. The wet etching of the mold layer pattern 115a is performed using oxide etchant, for example, buffered oxide etchant (BOE), for between about tens and hundreds of seconds.

Next, as illustrated in FIG. 1, a dielectric layer 121 is deposited on the whole surface of the supporting layer 101 on which the lower electrode 117a of a stack type is formed. The dielectric layer 121 may be formed of $(Ba, Sr)TiO_3$, $SrTiO_3$, $BaTiO_3$, $Ba(Zr, Ti)O_3$, $Sr(Zr, Ti)O_3$, $Pb(Zr, Ti)O_3$, or $(Pb, La)(Zr, Ti)O_3$.

Then, an upper electrode 123 is formed on the dielectric layer 121 with a metal film, so that the semiconductor device having the MIM capacitor is completely fabricated. The upper electrode 123 may have the same film material as the lower electrode 117a.

Figure 12:
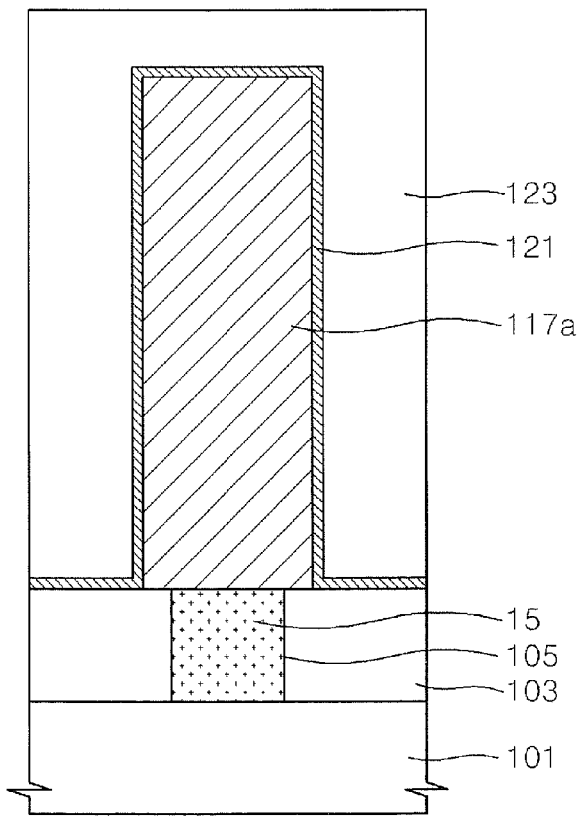
FIG. 12 is a cross-sectional view of a semiconductor device as a comparison example to the semiconductor device of FIG. 1.

FIG. 12 is a cross-sectional view of a semiconductor device as a comparison example of the semiconductor device of FIG. 1.

Like reference numerals in FIGS. 12 and 1 denote like elements. The semiconductor device of FIG. 12 has a similar structure as the semiconductor device of FIG. 1; a contact plug 15, however, is formed of TiN and/or W, and a lower electrode 117a and an upper electrode 123 is formed of Ru.

Figure 13:
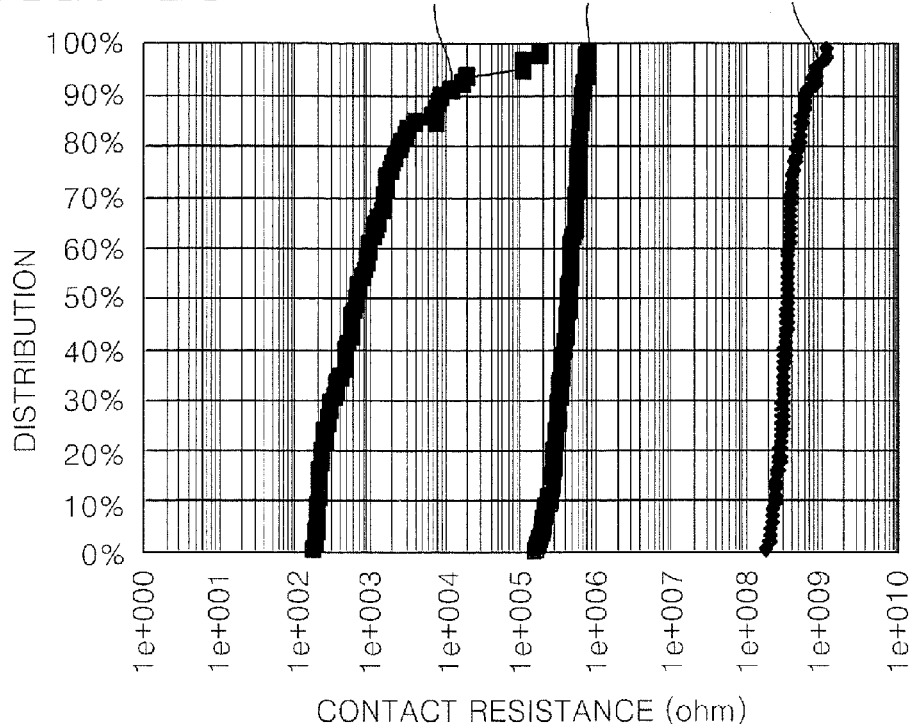
FIGS. 13 and 14 are graphs showing contact resistances of the semiconductor device of FIG. 1 and the semiconductor device of FIG. 12.
Figure 14:
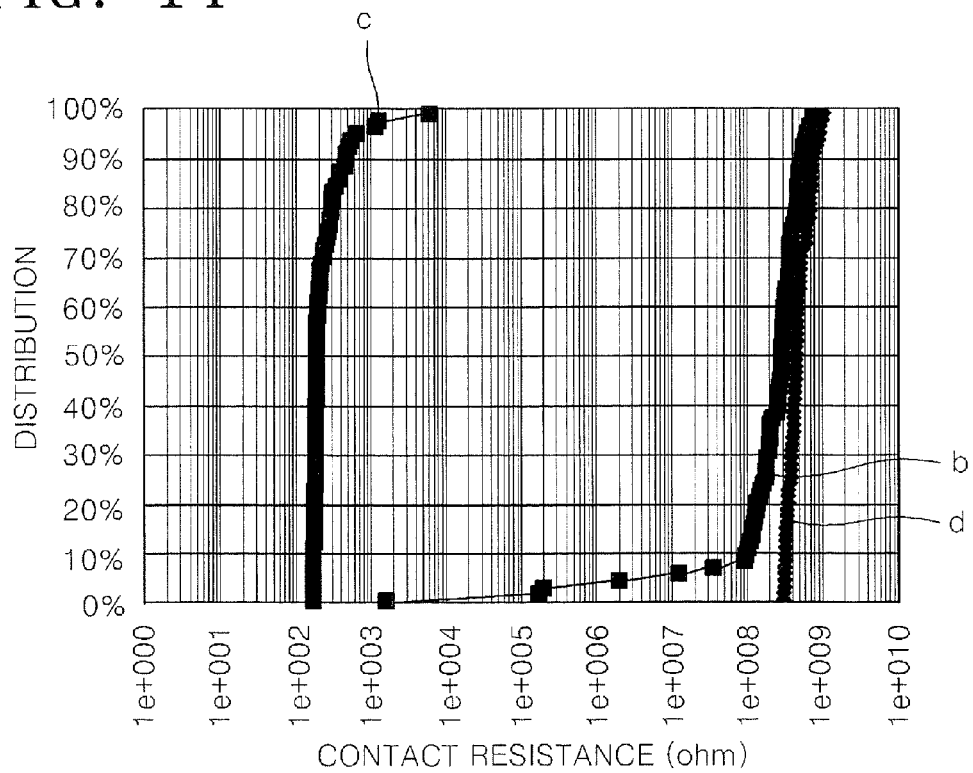

FIGS. 13 and 14 are graphs showing contact resistances of the semiconductor device of FIG. 1 and of the semiconductor device of FIG. 12.

More specifically, in FIGS. 13 and 14, an X axis represents contact resistance, and a Y axis represents distribution of contact resistance on a wafer. In FIGS. 13 and 14, the semiconductor device of FIG. 1 has the first contact plug CP1 formed of TiN, and the second contact plug 110a or CP2 formed of Ru.

The contact resistance of the semiconductor device in the comparison example, that is, the contact resistance between a semiconductor substrate, which is a supporting layer 101, and the contact plug 15 is about $10^6$ ohms if the contact plug 15 is formed of tungsten (e), or is about $10^9$ ohms, if the contact plug 15 is TiN, which are substantially high amounts. This is because that the contact plug 15 is oxidized due to entering oxygen in the course of deposition of the lower electrode or subsequent heat processing on the dielectric layer, for example, a high-heat processing with a temperature of between 500 and 600° C. A high contact resistance may cause damage to a semiconductor device or, even worse, stop the semiconductor device operating.

On the contrary, the contact resistance of the semiconductor device of FIG. 1, that is, the contact resistance (t between the supporting layer and the contact plug is only dozens of ohms, which is a relatively low amount, as shown in FIG. 13. It is understood that the reason of the low contact resistance is that the thin first contact plug CP1 is formed on the bottom and inner wall of the contact hole 105, the second contact plug CP2 is filled in the contact hole 105 and thus the contacting surface between the first contact plug CP1 and the second contact plug CP2 increases, which results in effective dispersion of oxygen entering from electrodes. Furthermore, oxygen is reduced or prevented from entering the first contact plug CP1 from the electrodes due to the structural characteristic described above, and thus the contact resistance is generally low.

Moreover, it is noted that the contact resistance varies, as shown in FIG. 14, according to the bottom thickness d1 of the first contact plug CP1 of the semiconductor device in FIG. 1. That is, when the bottom thickness d1 of the first contact plug CP1 is less than about 100 Å, as shown by reference letter "b" in FIG. 14, the contact resistance increases, and when the bottom thickness d1 of the first contact plug CP1 is 350 Å that is greater than 100 Å, the contact resistance is low, as shown by reference letter "c" in FIG. 14.

According to some embodiments of the present invention, a semiconductor device includes a first contact plug, which has a bottom thickness thicker than its inner wall thickness. Hence, the semiconductor device can reduce or prevent oxygen contained in an electrode of an MIM capacitor or used in the course of deposition or annealing of a dielectric layer from entering a supporting layer under a first contact hole, and thereby reduce the contact resistance between the first contact plug and the supporting layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A semiconductor device comprising:
   an insulating layer formed on a supporting layer and having a contact hole;
   a first contact plug formed on an inner wall and bottom of the contact hole;
   a second contact plug that buries the contact hole and is formed on the first contact plug; and
   a conductive layer that is connected to the first contact plug and the second contact plug;
   wherein a bottom thickness of the first contact plug formed on the bottom of the contact hole is thicker than an inner wall thickness of the first contact plug formed on the inner wall of the contact hole.

2. The semiconductor device of claim 1, wherein the first contact plug comprises a bottom plug formed on the bottom of the contact hole and an inner plug formed on the inner wall of the contact hole.

3. The semiconductor device of claim 2, wherein a sum of a thickness of the bottom plug and a thickness of the inner plug formed on the bottom plug is about equal to the bottom thickness of the first contact plug.

4. The semiconductor device of claim 2, wherein the thickness of the inner plug formed on the bottom plug and a thickness of the inner plug formed on the inner wall of the contact hole are about the same as each other.

5. The semiconductor device of claim 2, wherein a thickness of the bottom plug formed on the bottom of the contact hole ranges between about 50 and 400 Å and a thickness of the inner plug formed on the bottom plug over the bottom of the contact hole ranges between about 50 and 100 Å.

6. The semiconductor device of claim 1, wherein a thickness of the first contact plug formed on the bottom of the contact hole ranges between about 100 and 500 Å.

7. The semiconductor device of claim 1, wherein the first contact plug is formed of a refractory metal film and the second contact plug is formed of a noble metal film.

8. The semiconductor device of claim 7, wherein the refractory metal film forming the first contact plug is one of a W film, a WN film, a Ti film, a TiAlN film, a TiSiN film, a Ta film, a TaN film, a TaAlN film, and/or a TaSiN film, and the noble metal film forming the second contact plug is one of a Pt film, a Ru film, and/or an Ir film.

9. The semiconductor device of claim 1, wherein the supporting layer is a semiconductor substrate or a polysilicon layer.

10. A semiconductor device comprising:
a first insulating layer formed on a supporting layer and having a first contact hole;
a first contact plug formed on an inner wall and bottom of the first contact hole and having a bottom thickness thicker than an inner wall thickness of the first contact hole;
a second contact plug that buries the first contact hole and is formed on the first contact plug;
a second insulating layer that is deposited on the first contact plug and the second contact plug and has a second contact hole that exposes the first and second contact plugs;
a lower electrode of a metal insulator metal (MIM) capacitor that is deposited on the first and second contact plugs in the second contact hole, has a thickness thicker than a thickness of the second insulating layer, and is formed of a metal layer;
a dielectric layer of the MIM capacitor that is formed on the lower electrode; and
an upper electrode of the MIM capacitor that is deposited on the dielectric layer and formed of a metal layer.

11. The semiconductor device of claim 10, wherein the first contact plug comprises a bottom plug formed on the bottom of the first contact hole and an inner plug formed on the bottom plug and the inner wall of the first contact hole.

12. The semiconductor device of claim 11, wherein a thickness of the inner plug formed on the bottom plug and a thickness of the inner plug formed on the inner wall of the first contact hole are about the same each other.

13. The semiconductor device of claim 10, wherein the first contact plug is a refractory metal film, which is formed of a W film, a WN film, a Ti film, a TiN film, a TiAlN film, a TiSiN film, a Ta film, a TaN film, a TaAlN film, and/or a TaSiN film, and the second contact plug is a noble metal film which is formed of Pt, Ru, and/or Ir.

14. The semiconductor device of claim 10, wherein the lower and upper electrodes are formed of noble metal films, noble metal conductive oxide films, and/or conductive oxide films of a perovskite structure, and the dielectric layer is formed of a dielectric film of a perovskite structure.

15. The semiconductor device of claim 14, wherein the noble metal layer is formed of Pt, Ru, and/or Ir, the noble metal conductive oxide film is formed of PtO, RuO2, and/or IrO2, the conductive oxide film of a perovskite structure is formed of $SrRuO_3$, $BaRuO_3$, $CaRuO_3$, $(Ba, Sr)RuO_3$, and/or $La(Sr, CO)O_3$, and the dielectric layer is formed of $(Ba, Sr)TiO_3$, $SrTiO_3$, $BaTiO_3$, $Ba(Zr, Ti)O_3$, $Sr(Zr, Ti)O_3$, $Pb(Zr, Ti)O_3$, and/or $(Pb, La)(Zr, Ti)O_3$.

16. A method of fabricating a semiconductor device, the method comprising:
depositing an insulating layer having a contact hole on a supporting layer;
forming a bottom plug on a bottom of the contact hole;
forming a first contact plug that includes the bottom plug and an inner wall plug formed on the bottom plug and an inner wall of the contact hole and has a bottom thickness thicker than a thickness of the inner wall of the contact hole, and
forming a second contact plug on the first contact plug by burying the contact hole.

17. The method of claim 16, wherein the bottom plug is formed by partly etching a refractory metal film which is buried into the contact hole.

18. The method of claim 16, wherein the inner wall plug is formed on the inner wall of the contact hole and has generally uniform thickness.

19. The method of claim 16, wherein the first contact plug on the bottom of the contact hole has a thickness of between about 100 and 500 Å.

20. The method of claim 16, further comprising:
after forming the second contact plug, depositing a second insulating layer on the first contact plug and the second contact plug, the second insulating layer having a second contact hole that exposes the first and second contact plugs;
forming a lower electrode of an MIM capacitor, which is formed of a metal layer, on the first contact plug and the second contact plug in the second contact hole to have a thickness thicker than a thickness of the second insulating layer;
depositing a dielectric layer of an MIM capacitor on the lower electrode; and
forming an upper electrode of an MIM capacitor, which is formed of a metal layer, on the dielectric layer.

* * * * *